United States Patent
Wang

(10) Patent No.: US 10,249,771 B2
(45) Date of Patent: Apr. 2, 2019

(54) FILTER COLLIMATORS AND METHODS FOR FORMING THE SAME

(71) Applicant: VisEra Technologies Company Limited, Hsin-Chu (TW)

(72) Inventor: Wei-Ko Wang, Taoyuan (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 15/661,254

(22) Filed: Jul. 27, 2017

(65) Prior Publication Data

US 2019/0035947 A1    Jan. 31, 2019

(51) Int. Cl.
*H01L 27/146* (2006.01)
*H01L 31/0216* (2014.01)

(52) U.S. Cl.
CPC .. *H01L 31/02165* (2013.01); *H01L 31/02164* (2013.01); *H01L 27/14678* (2013.01)

(58) Field of Classification Search
CPC ................................................ H01L 27/14678
See application file for complete search history.

(56) References Cited

U.S. PATENT DOCUMENTS

| | | | |
|---|---|---|---|
| 2009/0244711 A1 | 10/2009 | Yokoyama et al. | |
| 2010/0264297 A1* | 10/2010 | Kurahashi | G02B 27/0018 250/208.1 |
| 2015/0318320 A1 | 11/2015 | Lin et al. | |

FOREIGN PATENT DOCUMENTS

| | | |
|---|---|---|
| CN | 103608705 A | 2/2014 |
| JP | 2009-258691 A | 11/2009 |
| JP | 2009-290414 A | 12/2009 |
| JP | 2010-134353 A | 6/2010 |
| JP | 2010-225904 A | 10/2010 |
| JP | 2015-134566 A | 7/2014 |
| JP | 2016-146619 A | 8/2016 |
| KR | 2016-0094299 A | 8/2016 |
| TW | 201018969 A | 5/2010 |
| TW | 201604585 A | 2/2016 |
| TW | 201614819 A | 4/2016 |

OTHER PUBLICATIONS

Office Action from the corresponding TW application dated Feb. 8, 2018, 9 pages.

\* cited by examiner

*Primary Examiner* — William A Harriston
(74) *Attorney, Agent, or Firm* — Muncy, Geissler, Olds & Lowe, P.C.

(57) ABSTRACT

A filter collimator is provided. The filter collimator includes a substrate having a photodiode. The filter collimator also includes an interference-type and an absorption-type filter film disposed over the substrate. When a first light is incident at a first angle relative to the normal of the top surface of the substrate, the interference-type filter film has a transmittance greater than 50% in a first waveband, and when a second light is incident at a second angle relative to the normal of the top surface of the substrate, the interference-type filter film has a transmittance greater than 50% in a second waveband, the absorption-type filter film has a transmittance greater than 50% in a third waveband, and wherein the first waveband partially overlaps the third waveband, the second waveband does not overlap the third waveband, and the second angle is greater than the first angle.

20 Claims, 10 Drawing Sheets

FILTER COLLIMATORS AND METHODS FOR FORMING THE SAME

BACKGROUND

Field of the Invention

The invention relates to a filter collimator and more particularly to a filter collimator including an interference-type filter film and an absorption-type filter film.

Description of the Related Art

Object imaging is useful in a variety of applications. By way of example, fingerprint identifiers are used for authenticating and/or verifying the users of the devices that incorporate these recognition systems. A fingerprint identifier provides a reliable, non-intrusive way to verify individual identity for recognition purposes. Various types of sensors may be used for biometric imaging.

A conventional optical fingerprint identifier is a system with a large number of optical elements, such as beam splitters, collimators, focusing mirrors, and linear sensors. Although conventional optical fingerprint identifiers have been generally adequate for their intended purposes, they have not been entirely satisfactory in all respects.

For example, crosstalk often occurs in conventional collimators, causing the reliability of the fingerprint identifier to become worse. Consequently, it is desirable to provide a solution for improving collimators.

BRIEF SUMMARY

According to some embodiments, a filter collimator is provided. The filter collimator includes a substrate having a photodiode. The filter collimator includes a first light-shielding layer disposed over the substrate, having an aperture corresponding to the photodiode. The filter collimator also includes an interference-type filter film disposed between the substrate and the first light-shielding layer. The filter collimator further includes an absorption-type filter film disposed over the substrate. When a first light is incident at a first angle relative to the normal of the top surface of the substrate, the interference-type filter film has a transmittance greater than 50% in a first waveband, and when a second light is incident at a second angle relative to the normal of the top surface of the substrate, the interference-type filter film has a transmittance greater than 50% in a second waveband, the absorption-type filter film has a transmittance greater than 50% in a third waveband, and wherein the first waveband partially overlaps the third waveband, the second waveband does not overlap the third waveband, and the second angle is greater than the first angle.

According to some embodiments, a method for forming a filter collimator is provided. The method includes providing a substrate which has a photodiode. The method also includes disposing a first light-shielding layer over the substrate, wherein the first light-shielding layer has an aperture corresponding to the photodiode. The method also includes disposing an interference-type filter film between the substrate and the first light-shielding layer. The method further includes disposing an absorption-type filter film over the substrate; wherein when a first light is incident at a first angle relative to the normal of the top surface of the substrate, the interference-type filter film has a transmittance greater than 50% in a first waveband, and when a second light is incident at a second angle relative to the normal of the top surface of the substrate, the interference-type filter film has a transmittance greater than 50% in a second waveband, the absorption-type filter film has a transmittance greater than 50% in a third waveband, and wherein the first waveband partially overlaps the third waveband, the second waveband does not overlap the third waveband, and the second angle is greater than the first angle.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

Figure 1:
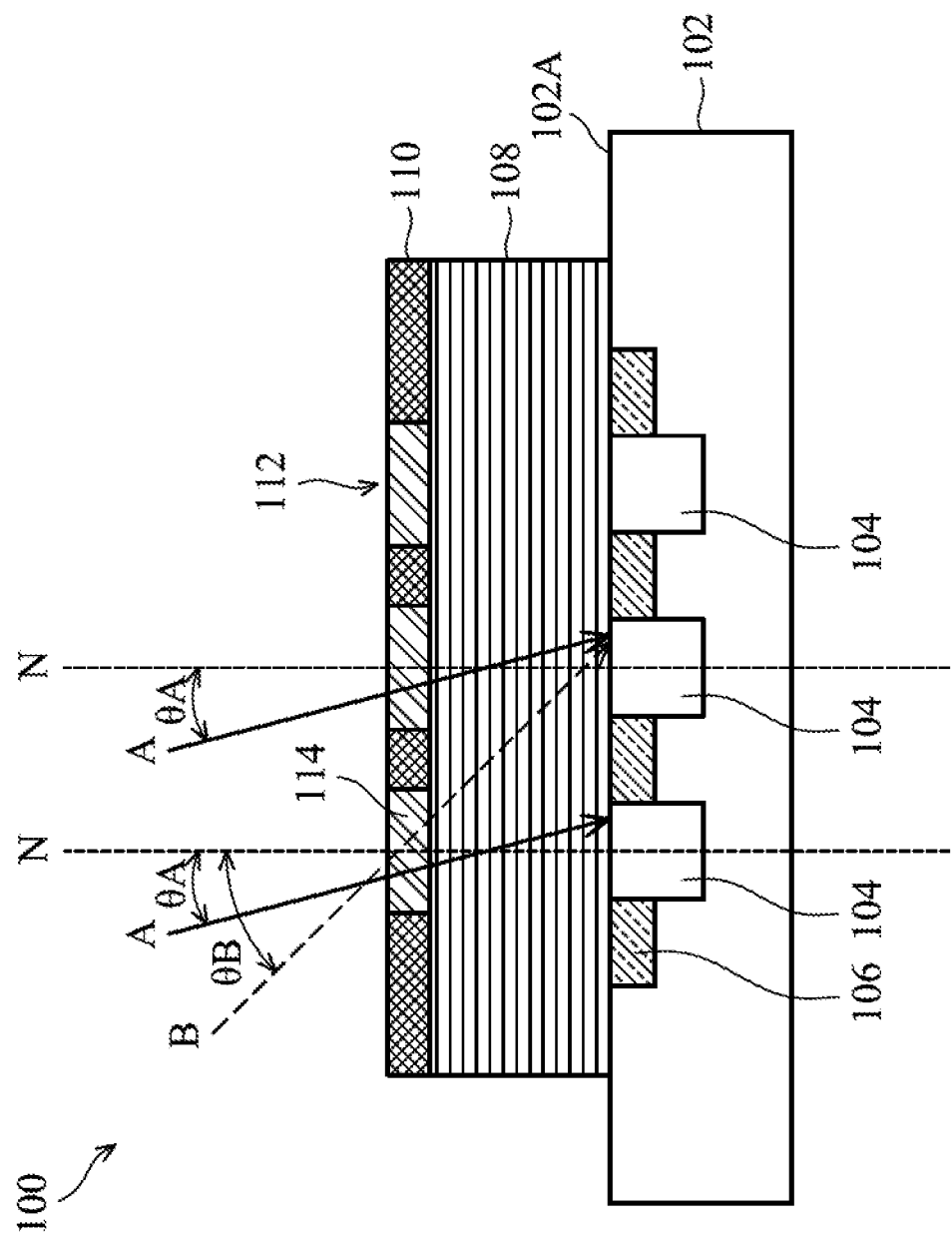
FIG. 1 is a cross-sectional view of a filter collimator in accordance with some embodiments of the present disclosure.

The filter collimator of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Referring to FIG. 1, FIG. 1 is a cross-sectional view of a filter collimator 100 in accordance with some embodiments of the present disclosure. As shown in FIG. 1A, the filter collimator 100 includes a substrate 102. The substrate 102 may include, but is not limited to, a semiconductor substrate such as a silicon substrate. In addition, the substrate 102 may include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 102 may include a semiconductor-on-insulator (SOI).

In some embodiments, as shown in FIG. 1, the substrate 102 includes a photodiode 104 and a wiring layer 106. The photodiode 104 may include a p-n junction structure or a PIN (p-type, intrinsic and n-type) structure. The current is generated when photons are absorbed in the photodiode 104, and a light signal is converted into a current signal.

The wiring layer 106 is disposed between two neighboring photodiodes. The wiring layer 106 is made of conductive material. In some embodiments, the conductive material includes copper, aluminum, molybdenum, tungsten, gold, chromium, nickel, platinum, titanium, iridium, rhodium, the above alloys, another applicable metal conductive material, or a combination thereof. The wiring layer 106 is configured to absorb light which does not hit the photodiode 104.

It should be noted that the substrate 102 shown in FIG. 1 is merely an example for better understanding the concept of the disclosure, and the scope of the disclosure is not intended to be limiting. That is, besides the photodiode 104 and the wiring layer 106, the substrate 102 may include more semiconductor elements in various embodiments.

In some embodiments, as shown in FIG. 1, the filter collimator 100 also includes an interference-type filter film 108. The interference-type filter film 108 is disposed over the substrate 102. The interference-type filter film 108 may be a multi-film filter and may include dielectric material or inorganic material. The material may include $TiO_2$, $HfO_2$, $NbTiO_5$, $SiO_2$, other suitable materials or a combination thereof. The interference-type filter film 108 may be formed by a deposition process, an etching process, a lithography process, other suitable process or a combination thereof.

The deposition process includes, but is not limited to, physical vapor deposition (PVD), chemical vapor deposition (CVD), sputtering, resistive thermal evaporation, electron beam evaporation, and any other applicable methods. The lithography process includes, but is not limited to, photoresist coating (e.g., spin-on coating), soft baking, mask alignment, exposure, post-exposure baking, developing the photoresist, rinsing and drying (e.g., hard baking). The lithography process may also be implemented or replaced by another proper method such as maskless photolithography, electron-beam writing or ion-beam writing. The etching process may include, but is not limited to, dry etching, wet etching, and other etching methods.

The transmittance of the interference-type filter film 108 is dependent on the angle of an incident light. Due to the interference-type filter film 108 having thin-film interference effect when the lights are incident at different angles, the different wavelength of the light are blocked or absorbed by the interference-type filter film 108. For example, as shown in FIG. 1, when a light A and a light B are incident at angle θA and θB relative to the normal of a top surface 102A of the substrate 102 respectively, the interference-type filter film 108 allows different waveband of light to pass through.

Figure 4A:
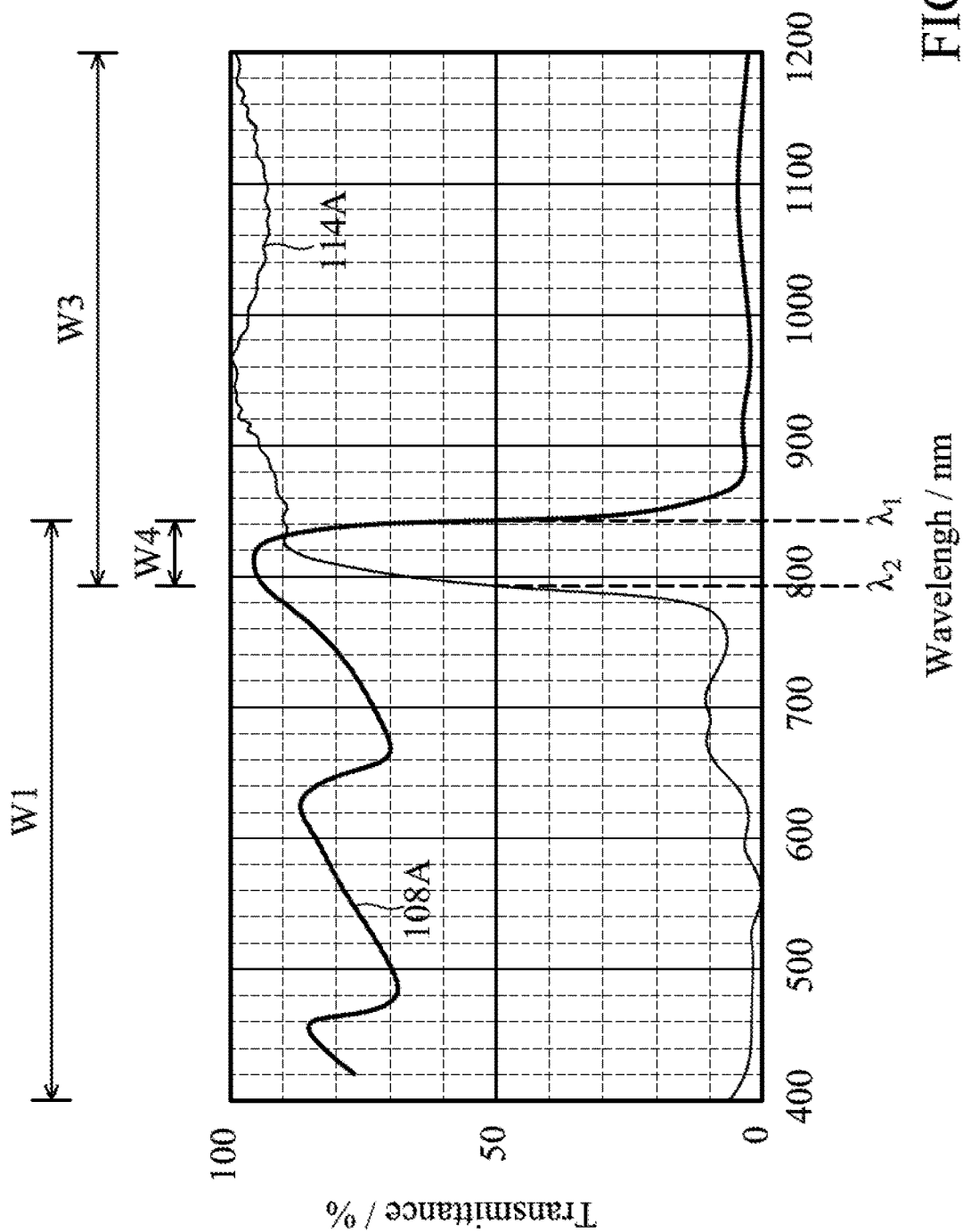
FIGS. 4A and 4B are graphs of transmittance against wavelength to illustrate the optical characteristics of an interference-type filter film and an absorption-type filter film of a filter collimator according to some embodiments.
Figure 4B:
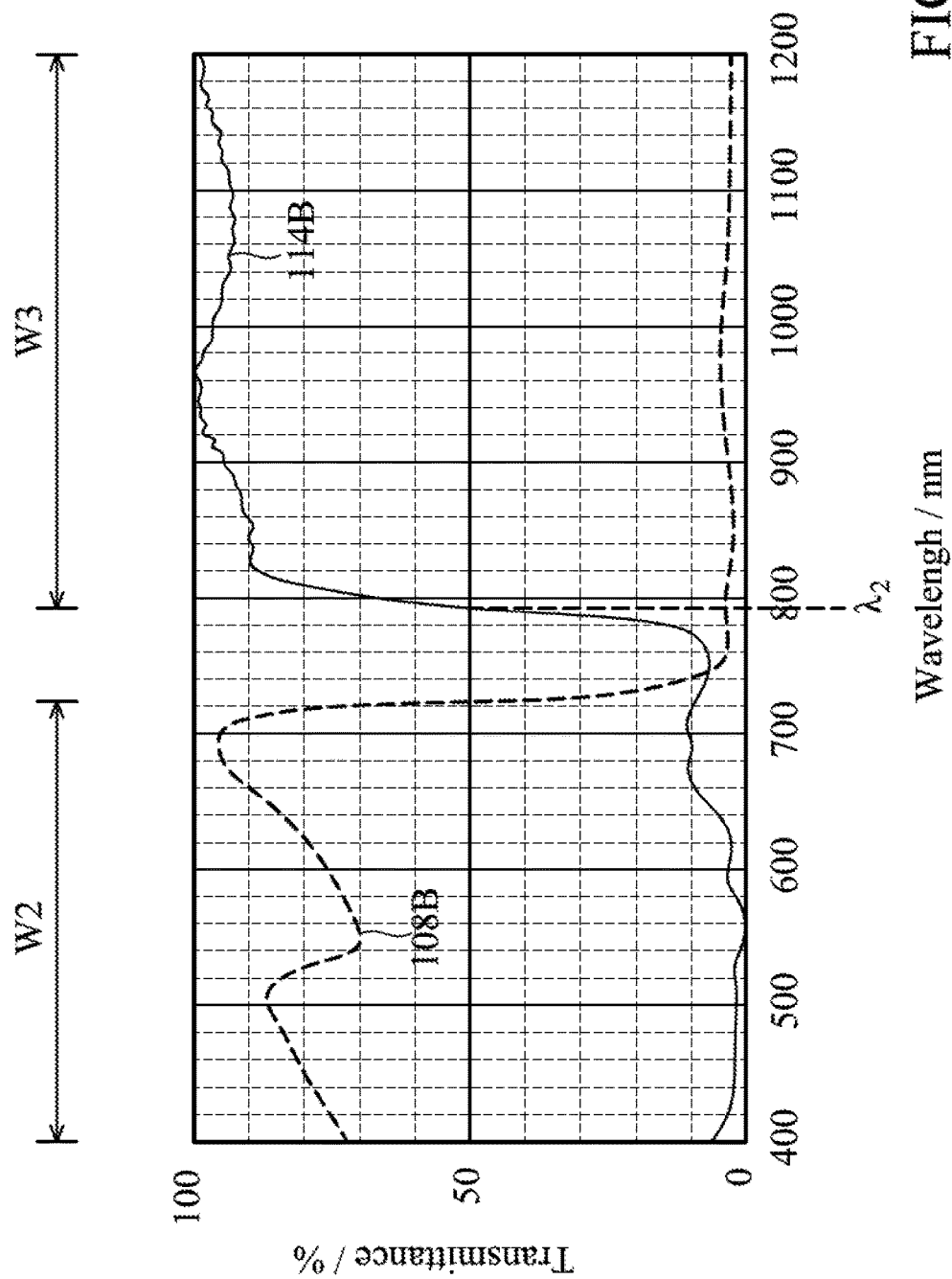

Referring to FIG. 4A and FIG. 4B, FIGS. 4A and 4B illustrate the optical characteristics of the interference-type filter film 108 when the lights are incident at different angles. When the light A is incident at an angle θA relative to the normal N of the top surface 102A of the substrate 102, the spectrum of the transmittance against wavelength of the interference-type filter film 108 is remarked as 108A; when the light B is incident at an angle θB greater than the angle θA, the spectrum of the transmittance against wavelength of the interference-type filter film 108 is remarked as 108B. As shown in FIGS. 4A and 4B, when the light is incident at a greater angle (e.g. θB), the interference-type filter film 108 allows shorter wavelength of light to pass through, and this phenomenon is called blue-shifting/angle-shifting.

Turning back to FIG. 1, in some embodiments, the filter collimator 100 also includes a first light-shielding layer 110. The first light-shielding layer 110 is disposed over the interference-type filter film 108 and has an aperture 112 corresponding to the photodiode 104. The first light-shielding layer 110 may include, but is not limited to, black photoresist, black printing ink, black resin or any other suitable light-shielding materials. Generally, the light-shielding materials prevent light from being transmitted, and are not limited to the absorption of light. The light-shielding materials and may also be highly reflective.

In some embodiments, the filter collimator 100 further includes an absorption-type filter film 114. In some embodiments, as shown in FIG. 1, the absorption-type filter film 114 is disposed in the aperture 112 of the first light-shielding layer 110. The absorption-type filter film 114 may be a pigment filter made of organic films. The absorption-type filter film 114 may be configured as a single filter or two or more filter layers. For example, the absorption-type filter film 114 may be made of a red filter layer positioned under a blue filter layer. One of the differences between the absorption-type filter film 114 and the interference-type filter film 108 is that the absorption-type filter film 114 is angle-independent.

Referring to FIG. 4A and FIG. 4B, FIGS. 4A and 4B illustrate the optical characteristics of the absorption-type filter film 114 when the lights are incident at different angles. When the light A is incident at the angle θA relative to the normal N of the top surface 102A of the substrate 102, the spectrum of the transmittance against wavelength of the absorption-type filter film 114 is remarked as 114A; when the light B is incident at the angle θB greater than the angle θA, the spectrum of the transmittance against wavelength of the absorption-type filter film 114 is remarked as 114B. As shown in FIGS. 4A and 4B, no matter what angle of the light is incident at, the absorption-type filter film 114 allows almost the same wavelength of the light to pass through.

Referring to FIG. 4A, when the light A is incident at the θA relative to the normal N of the top surface 102A of the substrate 102, the interference-type filter film 108 has a transmittance greater than 50% in a first waveband W1, and the absorption-type filter film 114 has a transmittance greater than 50% in a third waveband W3. As shown in FIG. 4A, the interference-type filter film 108 allows short wavelength of light to pass through, and the first waveband W1 has a maximum wavelength $\lambda_1$; the absorption-type filter film 114 allows long wavelength of light to pass through, and the third waveband W3 has a minimum wavelength $\lambda_2$. The first waveband W1 and the third waveband W3 partially overlap in a fourth waveband W4 which is between the wavelength $\lambda_1$ and the wavelength $\lambda_2$. Namely, when the light A is incident at the θA, the light A will pass through the interference-type filter film 108 and the absorption-type filter film 114. Moreover, the overlap region of the spectrum 108A of the interference-type filter film 108 and the spectrum 114A of the absorption-type filter film 114 has a portion whose transmittance is greater than 50%.

Referring to FIG. 4B, when the light B is incident at the θB relative to the normal N of the top surface 102A of the substrate 102, the interference-type filter film 108 has a transmittance greater than 50% in a second waveband W2, and the absorption-type filter film 114 has a transmittance greater than 50% in the third waveband W3. As shown in FIG. 4B, the second waveband W2 does not overlap the third waveband W3. Although there is still an overlap region between the spectrum 108B of the interference-type filter film 108 and the spectrum 114B of the absorption-type filter film 114, the transmittance of the overlap region is very low such that the signal from this overlap region is insignificant. Namely, when the lights A and the B are incident to the same photodiode 104, the signal from the light B is much smaller than that's of from the light A.

Turning back to FIG. 1, since the signal from the light B is much smaller than that of from the light A, it means that the amount of light which pass through the aperture 112 directly above the photodiode 104 is much greater than that of through the other aperture 112 obliquely above the same photodiode 104. Therefore, it prevents from the crosstalk which is induced by the light passing through the aperture 112 which is located obliquely above the photodiode 104. As a result, only when the light is incident at an angle within a specific range to the photodiode 104, this light generates significant signal.

Figure 2:
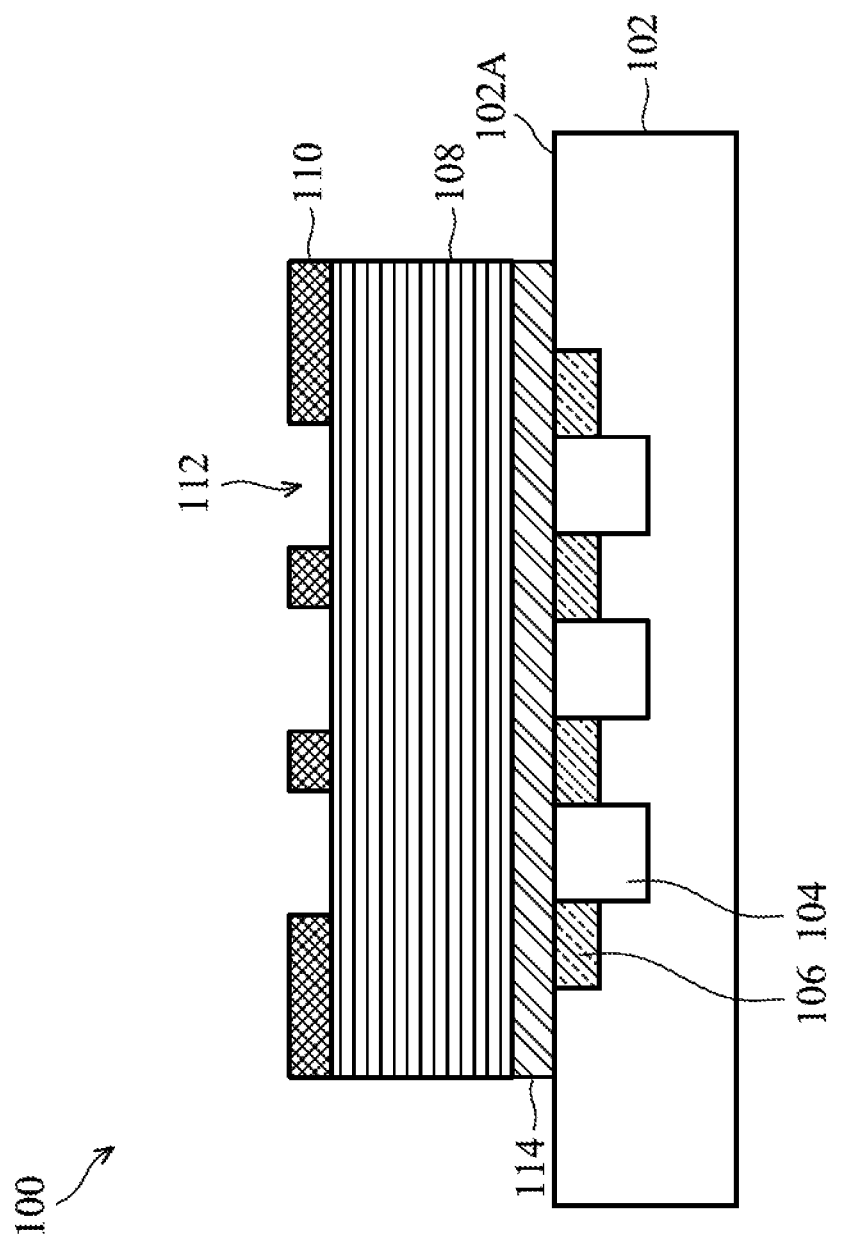
FIG. 2 is a cross-sectional view of a filter collimator in accordance with some embodiments of the present disclosure.

Referring to FIG. 2, FIG. 2 is a cross-sectional view of the filter collimator 100 in accordance with some embodiments of the present disclosure. Elements of the embodiments hereinafter that are the same or similar as those previously described with reference to FIG. 1 are not repeated for brevity. In some embodiments, as shown in FIG. 2, the absorption-type filter film 114 is disposed between the substrate 102 and the interference-type filter film 108. The aperture 112 of the first light-shielding layer 110 may be filled by other transparent materials (not shown) such as silicone, epoxy, poly(methyl methacrylate) (PMMA), polycarbonate (PC) and other applicable materials. In this embodiment, the absorption-type filter film 114 is in directly contact with the photodiode 104. Moreover, the absorption-type filter film 114 is a continuous layer that covers the photodiode 104.

Figure 3:
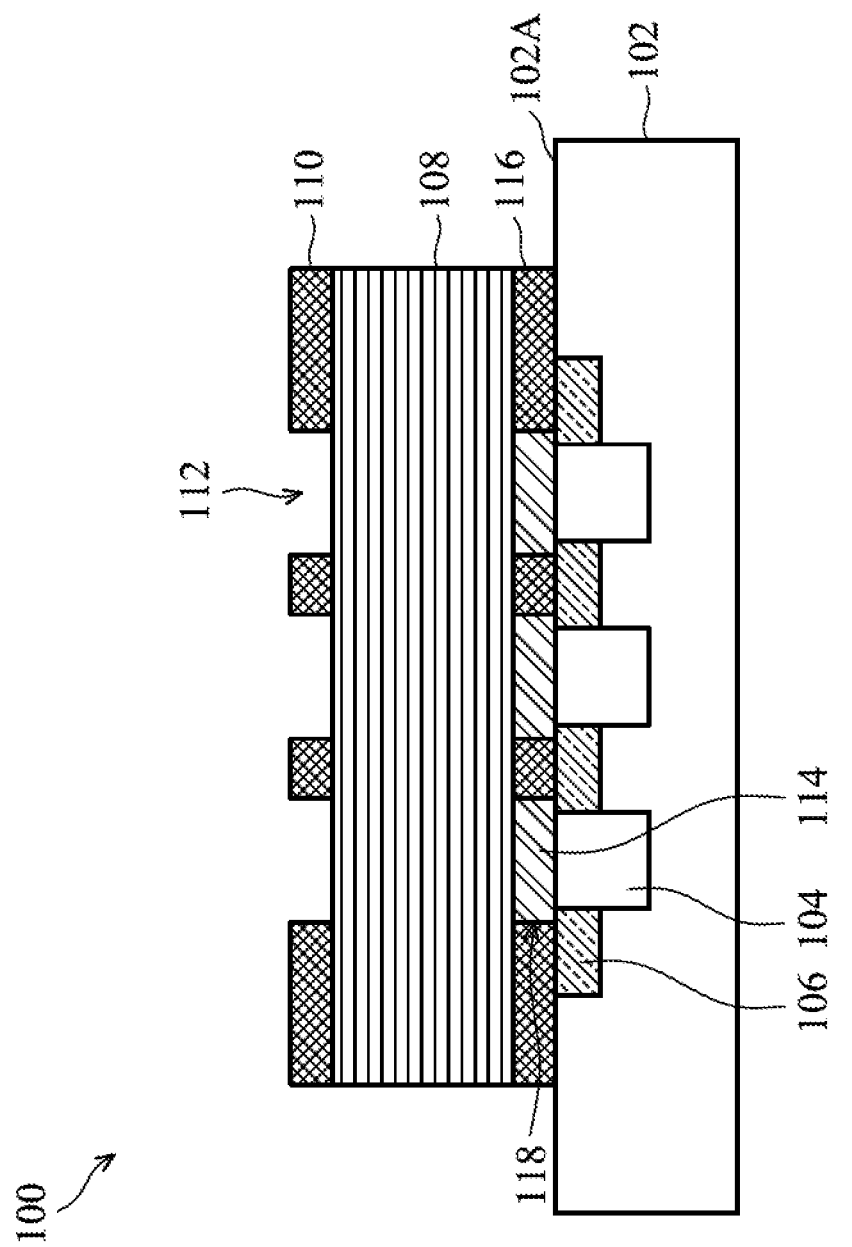
FIG. 3 is a cross-sectional view of a filter collimator in accordance with some embodiments of the present disclosure.

Referring to FIG. 3, FIG. 3 is a cross-sectional view of the filter collimator 100 in accordance with some embodiments of the present disclosure. Elements of the embodiments hereinafter that are the same or similar as those previously described with reference to FIG. 1 are not repeated for brevity. In some embodiments, as shown in FIG. 3, the filter collimator 100 further includes a second light-shielding layer 116. The second light-shielding layer 116 is disposed between the interference-type filter film 108 and the substrate 102. Moreover, the second light-shielding layer 116 has an aperture 118 corresponding to the photodiode 104 and the aperture 112. In some embodiments, the second light-shielding layer 116 is made of a material the same with that made of the first light-shielding layer 110.

In some embodiments, as shown in FIG. 3, the absorption-type filter film 114 is disposed in the aperture 118 of the second light-shielding layer 116, and the aperture 112 of the first light-shielding layer 110 may be filled by other transparent materials. Although FIG. 3 illustrates that the aperture 112 is completely align to the aperture 118 and the aperture 112 has the same width as the aperture 118, embodiments of the disclosure are not limited thereto. In some embodiments, the aperture 112 has different width from the aperture 118. Moreover, in some embodiments, the aperture 112 and the aperture 118 are misaligned. However, there is at least an overlap region corresponding to the photodiode 104 between the aperture 112 and the aperture 118.

Figure 5:
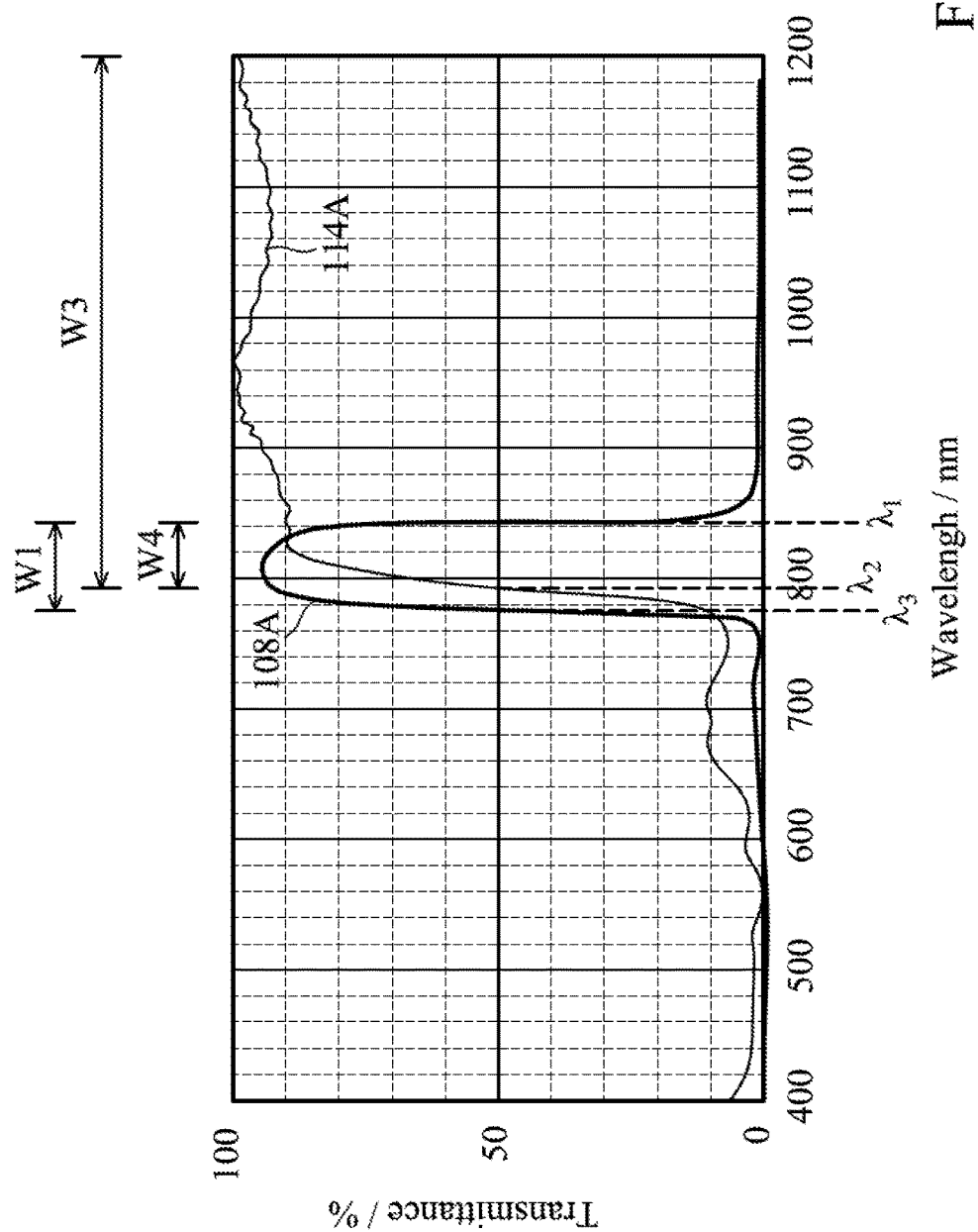
FIG. 5 is a graph of transmittance against wavelength to illustrate the optical characteristics of an interference-type filter film and an absorption-type filter film of a filter collimator according to some embodiments.

Referring to FIG. 5, FIG. 5 is a graph of transmittance against wavelength to illustrate the optical characteristics of the interference-type filter film 108 and the absorption-type filter film 114 when the light A is incident at the angle θA to the photodiode 104. Elements of the embodiments hereinafter that are the same or similar as those previously described with reference to FIG. 4A are not repeated for brevity. In some embodiments, as shown in FIG. 5, the spectrum 108A of the interference-type filter film 108 has a narrow band allowing the specific wavelength of light to pass through. In this embodiment, the interference-type filter film 108 has a transmittance greater than 50% in the first waveband W1, and the first waveband W1 has the maximum wavelength $\lambda_1$ and a minimum wavelength $\lambda_3$. In this embodiment, the minimum wavelength $\lambda_2$ of the third waveband W3 is longer than the minimum wavelength $\lambda_3$ of the first waveband W1. As shown in FIG. 5, the first waveband W1 and the third waveband W3 partially overlap in the fourth waveband W4 which is between the wavelength $\lambda_1$ and the wavelength $\lambda_2$.

Figure 6:
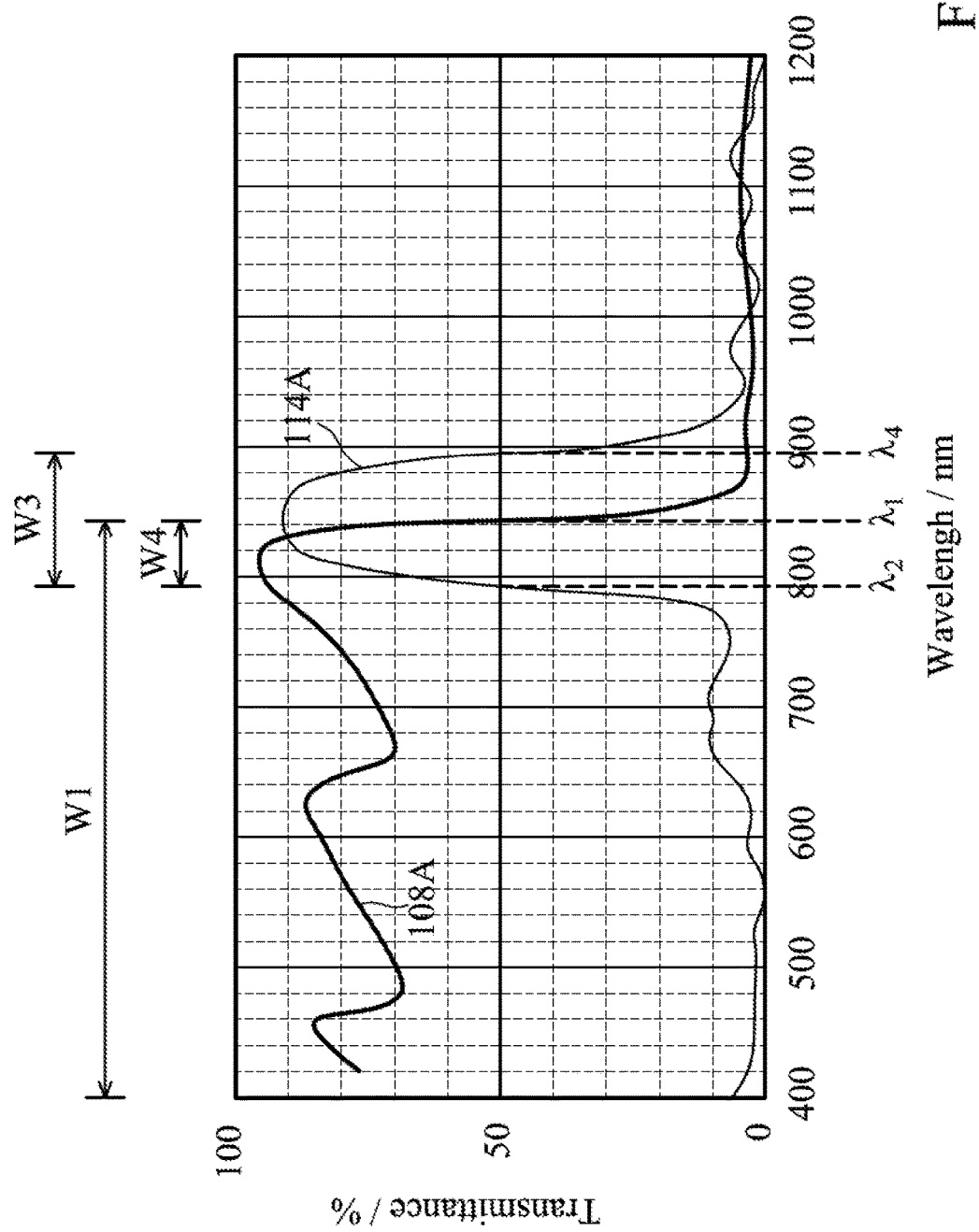
FIG. 6 is a graph of transmittance against wavelength to illustrate the optical characteristics of an interference-type filter film and an absorption-type filter film of a filter collimator according to some embodiments.

Referring to FIG. 6, FIG. 6 is a graph of transmittance against wavelength to illustrate the optical characteristics of the interference-type filter film 108 and the absorption-type filter film 114 when the light A is incident at the angle θA to the photodiode 104. Elements of the embodiments hereinafter that are the same or similar as those previously described with reference to FIG. 4A are not repeated for brevity. In some embodiments, as shown in FIG. 6, the spectrum 114A of the absorption-type filter film 114 has a narrow band allowing the specific wavelength of light to pass through. In this embodiment, the absorption-type filter film 114 has a transmittance greater than 50% in the third waveband W3, and the third waveband W3 has the minimum wavelength $\lambda_2$ and a maximum wavelength $\lambda_4$. In this embodiment, the maximum wavelength $\lambda_1$ of the first waveband W1 is shorter than the maximum wavelength $\lambda_4$ of the third waveband W3. As shown in FIG. 6, the first waveband W1 and the third waveband W3 partially overlap in the fourth waveband W4 which is between the wavelength $\lambda_1$ and the wavelength $\lambda_2$.

Figure 7:
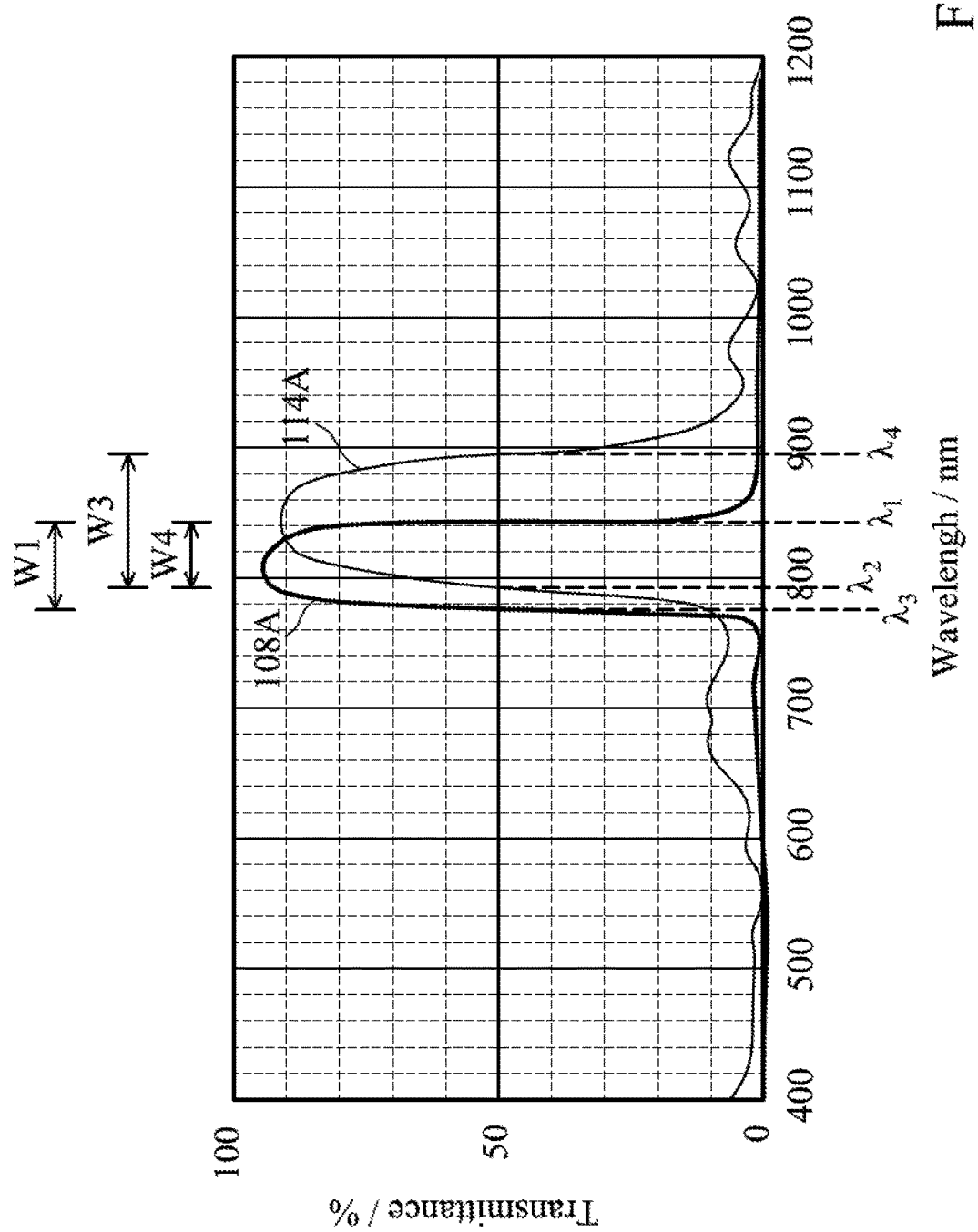
FIG. 7 is a graph of transmittance against wavelength to illustrate the optical characteristics of an interference-type filter film and an absorption-type filter film of a filter collimator according to some embodiments.

Referring to FIG. 7, FIG. 7 is a graph of transmittance against wavelength to illustrate the optical characteristics of the interference-type filter film 108 and the absorption-type filter film 114 when the light A is incident at the angle θA to the photodiode 104. Elements of the embodiments hereinafter that are the same or similar as those previously described with reference to FIG. 4A are not repeated for brevity. In some embodiments, as shown in FIG. 7, the spectrum 108A of the interference-type filter film 108 and the spectrum 114A of the absorption-type filter film 114 have narrow bands allowing the wavelength of light to pass through, respectively. In this embodiment, the interference-type filter film 108 and the absorption-type filter film 114 have transmittance greater than 50% in the first waveband W1 and the third waveband W3, respectively. The first waveband W1 has the maximum wavelength $\lambda_1$ and the minimum wavelength $\lambda_3$, and the third waveband W3 has the minimum wavelength $\lambda_2$ and the maximum wavelength $\lambda_4$. In this embodiment, the minimum wavelength $\lambda_2$ of the third waveband W3 is longer than the minimum wavelength $\lambda_3$ of the first waveband W1, and the maximum wavelength $\lambda_1$ of the first waveband W1 is shorter than the maximum wavelength $\lambda_4$ of the third waveband W3. As shown in FIG. 7, the first waveband W1 and the third waveband W3 partially overlap in the fourth waveband W4 which is between the wavelength $\lambda_1$ and the wavelength $\lambda_2$.

Although FIGS. 4A and 5-7 illustrate the fourth waveband W4 is between about 790 nm and 820 nm, embodiments of the disclosure are not limited thereto. In some embodiments, the peak of the fourth waveband W4 is between about 450 nm and 960 nm, and the full width at half maximum (FWHM) of the fourth waveband W4 is in a range between 10 nm and 50 nm.

Figure 8:
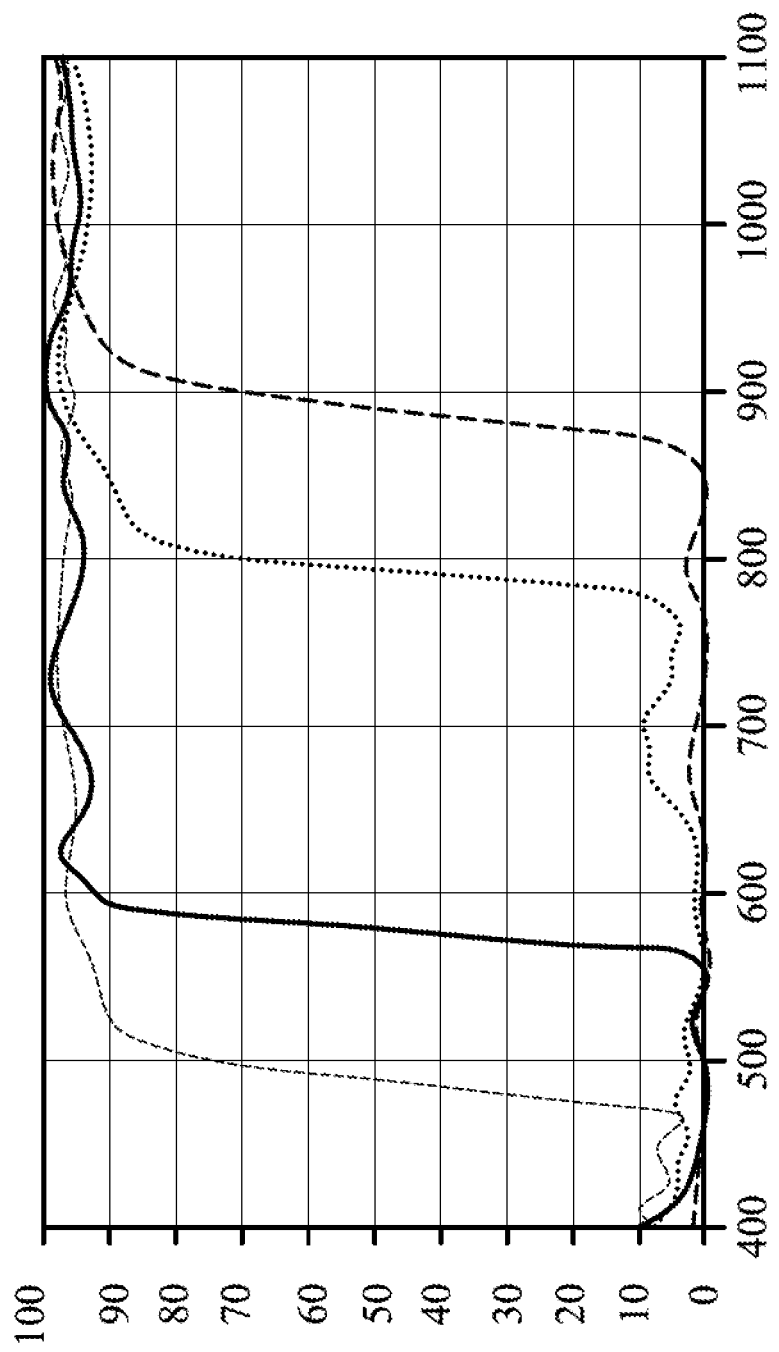
FIG. 8 is a graph of transmittance against wavelength to illustrate the optical characteristics of an absorption-type filter film according to some embodiments.

Referring to FIG. 8, FIG. 8 is a graph of transmittance against wavelength to illustrate the optical characteristics of the absorption-type filter film 114 of the filter collimator 100 according to some embodiments. As shown in FIG. 8, the absorption-type filter film 114 may be a yellow material which allows wavelength longer than about 450 nm of light to pass through, and wavelength shorter than about 450 nm of light is absorbed by the absorption-type filter film 114. The absorption-type filter film 114 may also be a red material which allows wavelength longer than about 560 nm of light to pass through, and wavelength shorter than about 560 nm of light is absorbed by the absorption-type filter film 114. Moreover, the absorption-type filter film 114 may be a material that allows infrared to pass through. In some embodiments, the minimum wavelength $\lambda_3$ of the absorption-type filter film 114 is about 450 nm, 560 nm, 780 nm or 870 nm.

Figure 9:
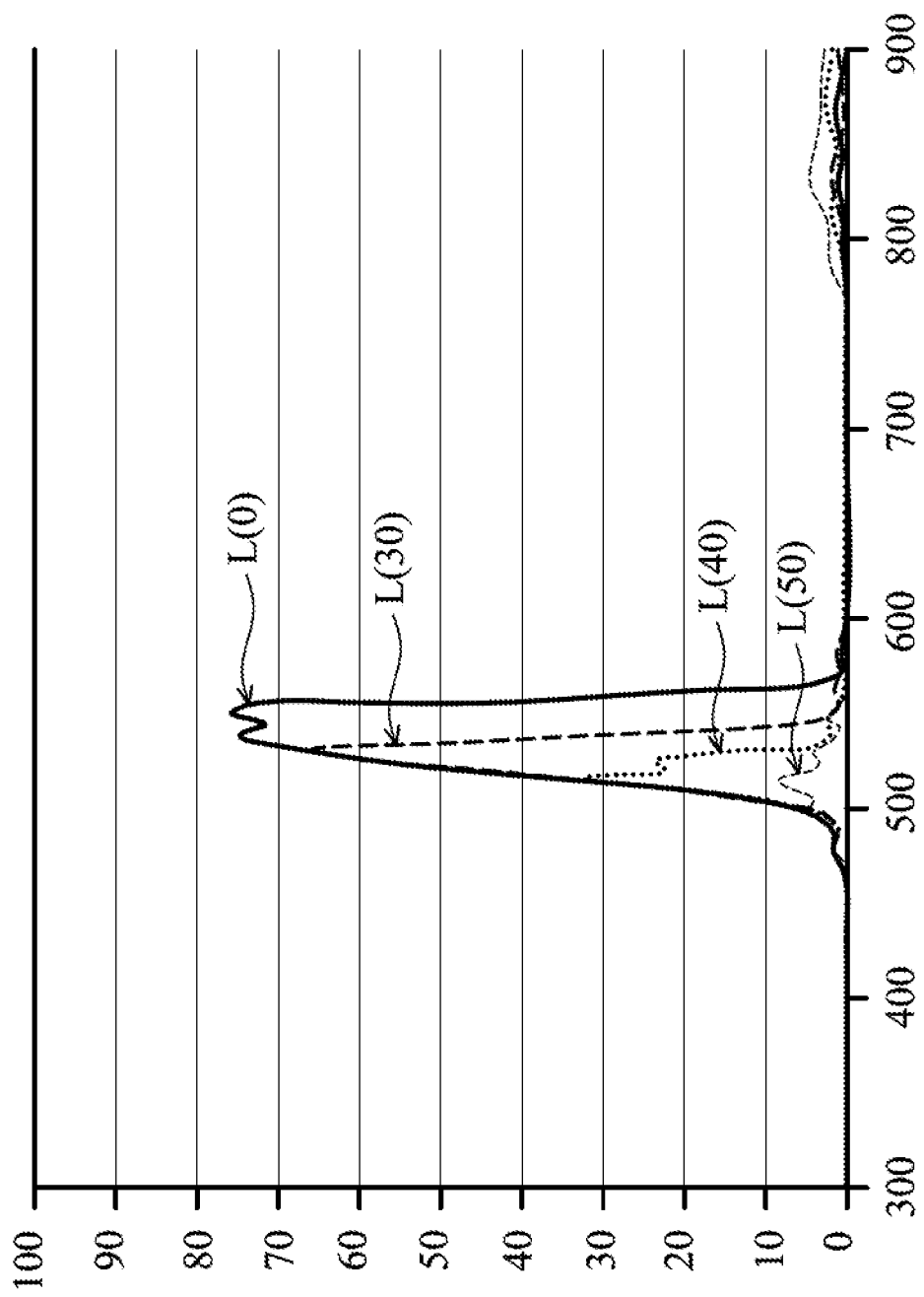
FIG. 9 is a graph of transmittance against wavelength to illustrate the optical characteristics of light passing through an interference-type filter film and an absorption-type filter film at different angles.

Referring to FIG. 9, FIG. 9 is a graph of transmittance against wavelength to illustrate the optical characteristics of the light passing through the interference-type filter film 108 and the absorption-type filter film 114 at different angles. The spectra L(0), L(30), L(40) and L(50) represent the overlap region between the spectrum of the interference-type filter film 108 and the spectrum of the absorption-type filter film 114. The number in the brackets represents that the angle of the incident light. For example, the L(0) represents that the path of the incident light is parallel to the normal of the top surface 102A of the substrate 102, and the L(30) represents that the light is incident at 30° relative to the normal of the top surface 102A of the substrate 102. As shown in FIG. 9, as the angle of the incident light becomes greater, the peak of the spectrum shifts toward shorter wavelength due to blue-shifting. Moreover, as the angle of the incident light becomes greater, the transmittance of the peak becomes smaller. As a result, the area of the overlap region between the spectra of the interference-type filter film 108 and the absorption-type filter film 114 becomes smaller.

In some embodiments, as shown in FIG. 9, the transmittance of the spectrum L(50) is almost smaller than about 10% in whole wavelength. In some embodiments, the transmittance of the spectrum L(40) is smaller than about 35% in whole wavelength. In some embodiments, the spectra L(30) and the L(0) have the portion whose transmittance is greater than 50%.

Although FIG. 9 illustrates that the spectrum L(40) is almost smaller than about 35% and the spectrum L(30) has the portion whose transmittance is greater than 50%, embodiments of the disclosure are not limited thereto. In some embodiments, the spectrum L(40) also has the portion whose transmittance is greater than 50%. For example, by designing the thickness of the interference-type filter film 108, the overlap region of the spectra between the interference-type filter film 108 and the absorption-type filter film 114 may be modified. For example, the wavelength of the peak and the FWHM of the fourth waveband W4 may be modified by controlling the thickness of the interference-type filter film 108.

In some embodiments, the angle θA shown in FIG. 1 is smaller than or equivalent to 30°. Namely, when the light is incident to the photodiode 104 at an angle smaller than or equivalent to 30°, the light generates significant signal, and when the light is incident to the photodiode 104 at an angle greater than 30°, the light generates nonsignificant signal. In other some embodiments, the angle θA shown in FIG. 1 is smaller than or equivalent to 40°. It represents that only when light is incident to the photodiode at an angle smaller than or equivalent to 40°, the light generates significant signal.

In some embodiments, the filter collimator 100 further includes a light source unit (not shown) which is configured to radiate light with a specific waveband onto an object such as a finger. The light radiated by the light source unit includes the wavelength in the fourth waveband W4. In this embodiment, the filter collimator 100 is used as an element of a fingerprint identifier.

Since the filter collimator includes the interference-type filter film and the absorption-type filter film, the filter collimator can receive specific wavelength of light. Moreover, it prevents from the crosstalk which is induced by the light passing through the aperture which is located obliquely above the photodiode. As a result, only when the light is incident at an angle within a specific range to the filter collimator, this light generates significant signal.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A filter collimator, comprising:
   a substrate having a photodiode;
   a first light-shielding layer disposed over the substrate, having an aperture corresponding to the photodiode;
   an interference-type filter film disposed between the substrate and the first light-shielding layer; and
   an absorption-type filter film disposed over the substrate;
   wherein when a first light is incident at a first angle relative to a normal of a top surface of the substrate, the interference-type filter film has a transmittance greater than 50% in a first waveband, and when a second light is incident at a second angle relative to the normal of the top surface of the substrate, the interference-type filter film has a transmittance greater than 50% in a second waveband, the absorption-type filter film has a transmittance greater than 50% in a third waveband, and wherein the first waveband partially overlaps the third waveband, the second waveband does not overlap the third waveband, and the second angle is greater than the first angle.

2. The filter collimator as claimed in claim 1, wherein the absorption-type filter film is disposed between the substrate and the interference-type filter film.

3. The filter collimator as claimed in claim 1, wherein the absorption-type filter film is disposed in the aperture of the first light-shielding layer.

4. The filter collimator as claimed in claim 1, further comprising:
   a second light-shielding layer disposed between the substrate and the interference-type filter film, wherein the second light-shielding layer has an aperture corresponding to the photodiode, and the absorption-type filter film is disposed in the aperture of the second light-shielding layer.

5. The filter collimator as claimed in claim 1, further comprising:
   a wiring layer disposed in the substrate and adjacent to the photodiode.

6. The filter collimator as claimed in claim 1, wherein the absorption-type filter film comprises a pigment or a polymer, and the interference-type filter film comprises an inorganic material.

7. The filter collimator as claimed in claim 1, further comprising:
   a light source unit configured to radiate light with a specific waveband onto an object, wherein the first waveband partially overlaps the third waveband in a fourth waveband, and the specific waveband comprises the fourth waveband.

8. The filter collimator as claimed in claim 7, wherein full width at half maximum (FWHM) of the fourth waveband is in a range between 10 nm and 50 nm.

9. The filter collimator as claimed in claim 8, wherein a peak of the fourth waveband is between 450 nm and 940 nm.

10. The filter collimator as claimed in claim 1, wherein the first angle is smaller than or equivalent to 40°.

11. The filter collimator as claimed in claim 1, wherein the maximum wavelength of the first waveband is a first wavelength, the minimum wavelength of the third waveband is a second wavelength, the first wavelength is longer than the second wavelength, the first waveband overlaps the third waveband in a fourth waveband, and the fourth waveband is between the second wavelength and the first wavelength.

12. The filter collimator as claimed in claim 11, wherein the second wavelength of the third waveband is longer than 450 nm.

13. The filter collimator as claimed in claim 11, wherein the minimum wavelength of the first waveband is a third wavelength, and the second wavelength of the third waveband is longer than the third wavelength of the first waveband.

14. The filter collimator as claimed in claim 11, wherein the maximum wavelength of the third waveband is a fourth wavelength, and the first wavelength of the first waveband is shorter than the fourth wavelength of the third waveband.

15. The filter collimator as claimed in claim 11, wherein the minimum wavelength of the first waveband is a third wavelength, the maximum wavelength of the third waveband is a fourth wavelength, the first wavelength of the first waveband is shorter than the fourth wavelength of the third waveband, and the second wavelength of the third waveband is longer than the third wavelength of the first waveband.

16. A method to form a filter collimator, comprising:
providing a substrate which has a photodiode;
disposing a first light-shielding layer over the substrate, wherein the first light-shielding layer has an aperture corresponding to the photodiode;
disposing an interference-type filter film between the substrate and the first light-shielding layer; and
disposing an absorption-type filter film over the substrate;
wherein when a first light is incident at a first angle relative to the normal of the top surface of the substrate, the interference-type filter film has a transmittance greater than 50% in a first waveband, and when a second light is incident at a second angle relative to the normal of the top surface of the substrate, the interference-type filter film has a transmittance greater than 50% in a second waveband, the absorption-type filter film has a transmittance greater than 50% in a third waveband, and wherein the first waveband partially overlaps the third waveband, the second waveband does not overlap the third waveband, and the second angle is greater than the first angle.

17. The method as claimed in claim 16, wherein the absorption-type filter film is disposed between the substrate and the interference-type filter film.

18. The method as claimed in claim 16, wherein the absorption-type filter film is disposed in the aperture of the first light-shielding layer.

19. The method as claimed in claim 16, further comprising:
a second light-shielding layer disposed between the substrate and the interference-type filter film, wherein the second light-shielding layer has an aperture corresponding to the photodiode, and the absorption-type filter film is disposed in the aperture of the second light-shielding layer.

20. The method as claimed in claim 16, further comprising:
disposing a light source unit which is configured to radiate light with a specific waveband onto an object, wherein the first waveband partially overlaps the third waveband in a fourth waveband, and the specific waveband comprises the fourth waveband.

* * * * *